United States Patent [19]

Hajdu et al.

[11] Patent Number: 4,717,439

[45] Date of Patent: Jan. 5, 1988

[54] PROCESS FOR THE TREATMENT OF COPPER OXIDE IN THE PREPARATION OF PRINTED CIRCUIT BOARDS

[75] Inventors: Juan Hajdu, Orange, Conn.; Martin W. Bayes, Ossining, N.Y.

[73] Assignee: Enthone, Incorporated, West Haven, Conn.

[21] Appl. No.: 790,999

[22] Filed: Oct. 24, 1985

[51] Int. Cl.$^4$ .......................... H05K 1/09; H05K 3/22; C23F 11/00

[52] U.S. Cl. .................................. 156/280; 156/278; 156/901; 148/6.24; 427/399; 427/96; 422/7

[58] Field of Search ........ 148/6.14 R, 6.24, DIG. 120; 156/280, 901, 902, 278; 174/68.5; 252/387, 397; 422/7; 427/96, 126.3, 343, 399; 428/209, 469, 901

[56] References Cited

U.S. PATENT DOCUMENTS

| | | | |
|---|---|---|---|
| 1,327,400 | 1/1920 | Merriman | 148/6.24 |
| 1,327,401 | 1/1920 | Merriman | 148/6.2 |
| 1,672,180 | 6/1928 | Smith | 252/387 X |
| 2,398,202 | 4/1946 | Zublin | 422/7 X |
| 2,878,149 | 3/1959 | Mason | 148/6.24 |
| 2,933,422 | 4/1960 | Mason | 148/6.24 |
| 2,990,300 | 6/1961 | Paskell | 428/469 X |
| 3,087,778 | 4/1963 | Negra | 252/387 X |
| 3,464,855 | 9/1969 | Shaheen | 427/96 |
| 3,546,775 | 12/1970 | Lalmond | 174/68.5 X |
| 3,677,828 | 7/1972 | Caule | 174/68.5 |
| 3,833,433 | 9/1974 | Caule | 156/901 X |
| 3,900,348 | 8/1975 | Zukriegel | 148/6.24 |
| 4,121,949 | 10/1978 | Walters | 148/6.14 R |
| 4,144,118 | 3/1979 | Stahl | 156/904 X |
| 4,190,474 | 2/1980 | Berdan | 156/902 X |

*Primary Examiner*—Kenneth M. Schor
*Attorney, Agent, or Firm*—John J. Tomaszewski; Kenneth A. Koch

[57] ABSTRACT

A composition and process is disclosed for improving the leach resistance of the copper oxide coating on the copper circuitry of printed circuit boards to solutions used in their preparation which comprises contacting the copper oxide of the circuit board with a solution containing an amphoteric element which forms an acidic oxide, such as selenium dioxide.

10 Claims, No Drawings

PROCESS FOR THE TREATMENT OF COPPER OXIDE IN THE PREPARATION OF PRINTED CIRCUIT BOARDS

BACKGROUND OF THE INVENTION

This invention relates to improving the leach resistance of copper oxide and, in particular, to enchancing the leach resistance of the copper oxide coating on the copper circuits of printed boards.

Printed circuit boards, including multilayer printed circuit boards, are well-known and are used extensively in electrical equipment. Basically, a flat sheet or layer of dielectric material such as epoxy, polyester, or other resin, contains the desired circuit design imprinted on its surface in the form of copper conductor circuits.

Two of the most used methods to form the copper conductor circuits are known as the subtractive method and the additive procedure. In the subtractive method, for example, a laminate of dielectric coated with a thin copper foil about 1.4 mil or 2.8 mil thick is covered with a photosensitive resist and a latent image of the desired circuit is formed in the resist. The remaining portion of the copper foil, corresponding to the non-circuit areas of the final circuit layer, is left unprotected and is etched away in a suitable solvent. The resulting circuit layer is then treated in a solvent to strip the remaining resist coating on the retained copper foil. Regardless of the method used, however, the resulting printed circuit layer contains copper conductor circuits on its surface in the desired circuit design.

Multilayer printed circuit boards are desirable for many applications since they provide good packaging density an weight and space are conserved. Multilayer boards are, in general, built from a number of printed circuit layers which are laminated together with the circuits being electrically connected by through-holes in the board which are coated with a conductor such as copper.

One of the problems confronting the industry however, is the adhesion of the copper circuit to the dielectric material since, without good adhesion, delamination of the board and electrical malfunctions could occur. This problem has been extensively researched and one method to improve adhesion is to chemically treat the printed circuit layers before lamination with oxidants to form a copper oxide coating on the copper surface. An alkaline aqueous solution of a chlorite salt is typically used. It is hypothesized that the copper oxide coating has a roughened surface which promotes adhesion between the copper circuit and dielectric substrate.

U.S. Pat. No. 4,409,037 discloses a method for improving the copper oxide adhesion to printed circuit substrates by employing an aqueous solution of an alkali metal chlorite and sodium or potassium hydroxide at specific concentration levels. U.S. Pat. No. 4,512,818 also utilizes an alkaline chlorite solution but includes a minor amount of a water soluble or dispersible polymer in solution to improve the adhesion properties of the resultant copper oxide coating. Both patents extensively discuss the preparation of printed circuit boards and the compositions and processes used to form adhesive copper oxide coatings and, including the patents and references referred to therein, are all incorporated herein by reference.

The use of copper oxide coatings, including the recent improved copper oxide coatings, have not, however, solved all the adhesion-type problems in printed circuit board manufacturing processes. During the through-hole plating steps, for example, the copper oxide coating is attacked by processing solutions such as HCl based catalysts, and acidic copper electroplating baths and leaching of the oxide occurs resulting in a "pink ring" around the hole area. The pink ring area has a low copper to dielectric bond strength and, in general, the larger the leached area the lower the bond strength and integrity of the board.

Depending on the use for the board and/or board manufacturer, the goal is to have substantally no leaching of the copper oxide, i.e., no pink ring, and it is very important that pink ring be minimized in the manufacturing process to avoid increased cost due to board rejection.

SUMMARY OF THE INVENTION

The present invention provides a composition and process for improving the leach resistance of copper oxide by contacting the copper oxide for a sufficient time with a solution containing an amphoteric element which forms an acidic oxide such as selenium, tellurium or sulfur. The solution is preferably acidic and may contain the amphoteric element at concentrations up to saturation. While not wishing to be bound to any specific theory, it is hypothesized that the treating solutions react with the copper oxide to form, e.g., a copper selenide compound, which is highly resistant to attack by post-treatment plating and other board manufacturing procedures.

The process is particularly applicable to the manufacture of multilayer printed circuit boards where the copper conductor circuit design has a layer of copper oxide formed on the conductor surface to promote adhesion between the circuit layers. The copper oxide layer is generally formed using a caustic-chlorite bath although any suitable oxide forming composition may be employed.

DETAILED DESCRIPTION OF THE INVENTION

The copper oxide to be treated according to the invention may be formed using any process and under varying conditions. Generally, the copper oxide layer produced on copper is black in color but, depending on the composition employed and temperature and length of contact, the color of the oxide formed may vary from brown, or light red to black. It is contemplated herein that the treatment of the invention is applicable to any copper oxide regardless of the method of formation. For many applications a black copper oxide coating is preferred and the present invention has been found to provide excellent leaching resistance for black oxides.

As noted hereinabove, in U.S. Pat. Nos. 4,409,037 and 4,512,818, the blackening solutions conventionally used comprise an alkaline solution of an oxidant such as a chlorite or a per compound such as a peroxydiphosphate. In an early patent directed to blackening copper, U.S. Pat. No. 2,364,993, the disclosure of which is incorporated by reference, compositions containing sodium chlorite at 5 g/l to saturation and sodium hydroxide at 10 g/l to 1000 g/l and operating temperatures up to boiling are shown. U.S. Patent No. 4,409,037 shows a composition providing enhanced adhesion of the copper oxide comprising an aqueous solution containing an alkali metal chlorite or alkaline earth metal chlorite at a concentration of from 5 to 25 g/l. The compositions are said to provide an improved copper oxide film, which are brown in color, within commercial periods of time on the order of 7 minutes or less at practically low temperatures from 80° F. to 200° F.

The composition used to treat the copper oxide is an aqueous solution of an amphoteric element which forms an acidic oxide such as selenium, tellurium or sulfur. $SeO_2$ is the preferred compound because of its demonstrated effectiveness. Other elements such as arsenic, antimony and the like may also be suitably employed. Exemplary sulfur materials include sulfurous acid and thiourea and substituted thoureas, e.g., diethyl thiourea. It is also preferred that the solution be acidic with a highly preferred pH being below about 5 and more preferably below about 3, e.g., 1–3, and most preferably 2–3. An acid or base may be added to adjust the solution to the desired pH. It is preferred for some applications that the solution contain an acid with HCl and phosphorous containing acids being preferred.

The concentration of the solution may vary widely and, in general, the amphoteric element containing component is in an amount of about 0.1 g/l to saturation, preferably 1 g/l to 30 g/l and most preferably 1.5 g/l to 5 g/l. The acid component, if employed, is in an amount up to 50 g/l or higher, and more preferably is about 0.1 to 10 g/l, e.g., 0.15 to 2 g/l. A preferred composition contains $SeO_2$ in an amount of 2 to 5 g/l and another contains, in addition, HCl or $H_3PO_4$ in an amount of 0.15 to 1 g/l.

Other additives such as wetting agents, may also be used in the composition for special purposes as would be appreciated by those in the art.

To practice the method of the invention, the copper oxide is contacted with the composition for a time sufficient to increase the leaching resistance of the copper oxide to post treatment procedures such as, in the case of printed circuit board manufacture, sulfuric acid based copper electroplating solutions. Contacting procedures may vary widely and immersion of the part in the solution for up to about 10 minutes at room temperature and preferably for less than 5 minutes is usually adequate to increase the leaching resistance of the copper oxide. Elevated temperatures may also be employed, e.g., 50° C. or higher, although this would increase the cost of the process. The time and temperature will vary depending on the copper oxide being treated and the composition of the solution as will be appreciated by those skilled in the art. Other means such as spraying may be used for treating the copper oxide coating.

In general and for purposes of illustration, the process of the invention will be described for the manufacture of printed circuit boards (PCB's). To make a PCB from start to finish involves numerous etching, rinsing and plating steps using a wide variety of compositions from highly acidic to highly alkaline, as well as oxidizing and reducing solutions, with the solutions being used at both low and high temperatures.

Starting with a dielectric epoxy layer (board) bearing surface copper circuitry, those boards requiring lamination to form, e.g., the innerlayers of the multilayer printed circuit board, are treated with an oxidizing solution as discussed hereinabove to produce a copper oxide film on the copper surface. The composition of the invention is then used to contact the copper oxide to enhance the leach resistance of the oxide. After treatment, the layer is "laid-up" and laminated together using heat and pressure with other treated layers, prepregs and untreated layers, such as the outer layer circuit bearing boards, to form the multilayer board. The treated layer usually have circuits on both sides and are laminated with prepregs to form the final multilayer board. Copper foil containing a copper oxide coating may also be used as a layer or layers in the multilayer board. A predesigned series of through-holes is then formed in the board in any conventional manner. The through-holes must now be plated to electrically connect the circuits on the different layers and a wide variety of processes may be employed for this procedure.

In general, the holes must first be treated to remove resin smear caused by the hole forming operation and to, at times, etch-back the dielectric layer. Chemicals are usually employed for this purpose and smear-removal and etch-back agent include sulfuric and chromic acids and alkaline permanganate solutions.

The board is now ready for electroless metal plating and is usually pretreated by cleaning with a composition such a ENPLATE ® PC-475 or PC-499 (sold by Enthone, Incorporated, West Haven, Conn.) to remove hydrocarbon soils and oxides followed by microetching of the copper using an etchant such a ENPLATE AD-485. Thereafter, the board is immersed in a catalyst, such as a tin-palladium solution, which conditions the surface of the epoxy for electroless copper plating. ENPLATE Activator 444 is exemplary of this type catalyst. Following a water rinse, the laminate is immersed in an accelerator such as ENPLATE PA-491 to activate the catalyst by freeing the metal palladium ions on the board. After rinsing, the board is dried and is immersed in an electroless copper plating solution for a period of time sufficient to plate copper to the desired thickness on the hole surfaces. ENPLATE CU-700 and other similar plating compositions may be employed. The boards are then normally electroplated using conventional techniques if a thicker coating is desired.

Many of the above treating solutions, especially the acid cleaning and pretreatment solutions and, particularly the acid copper electroplating solution, are extremely aggressive and may attack the copper oxide forming pink ring. The composition and process of the invention significantly reduces this attack and the formation of pink ring and lowers the rejection rate of the boards.

The following example is set forth in order to further illustrate the present invention. It will be understood that throughout this specification and claims, all parts and percentages are by weight and all temperatures in degrees Centigrade unless otherwise specified.

EXAMPLE

A 3 inch ×3 inch copper foil 1.4 mil thick was cleaned in an alkaline soak cleaner (ENPLATE PC-499) at 180° F. for 5 minutes after rinsing, the foil was etched in ENPLATE AD-485 at room temperature. The etched foil was rinsed and dipped in 10% $H_2SO_4$ for 1 minute and rinsed successively in cold tap water and deionized water.

The treated foil was immersed in a caustic-chlorite salt based bath (ENPLATE MB-2620) for 4 minutes at 170° F. to form a copper oxide coating. The foil was then rinsed and dried.

A second foil was treated using the same procedure except that the treated foil was immersed in a solution containing 4.8 g/l $SeO_2$ and 0.6 g/l 37% HCl for 1 minute at room temperature. The foil was then rinsed and dried.

A laminate was formed using two untreated copper foils, the two treated foils and difunctional epoxy prepregs obtained from Oak Materials Group Inc., Laminates Division, Hoosick Falls, N.Y., at 350° F. and 350 psi. The laminate was formed by layering from top to bottom, untreated foil, two layers of prepreg, the treated foil, two layers of prepreg, the SeO$_2$ treated foil, two layer of prepreg and untreated foil.

Holes were then drilled in the laminate with #60 and #40 size drills. The drilled laminate was immersed for 2 minutes at room temperature in an acid copper electroplating bath containing 90 g/l copper sulfate. 5 H$_2$O and 215 g/l sulfuric acid.

To examine the laminate for leaching resistance, i.e. pink ring, the top and bottom copper foils were ground away leaving the two treated foils encapsulated with cured epoxy. The holes were viewed with an optical microscope from both sides of the laminate to compare the two treated foils of each hole for pink ring. The foil treated with the SeO$_2$ solution had no significant amount of pink ring whereas a significant amount of pink ring, which would require rejection of the laminate, was found in the foil not having the SeO$_2$ treatment.

It will be apparent that many changes and modifications of the several features described herein may be made without departing from the spirit and scope of the invention. It is therefore apparent that the foregoing description is by way of illustration of the invention rather than limitation of the invention.

We claim:

1. A process for improving the leach resistance of copper oxide to an acid copper electroplating bath comprising contacting the copper oxide layer on top of a copper layer of a printed circuit board laminate for a sufficient time to provide increased leach resistance to said copper electroplating bath with an aqueous solution containing an element selected from the group consisting of selenium, tellurium, sulfur and mixtures thereof and having a pH of about 1 to 5.

2. The process of claim 1 wherein the copper oxide is a surface coating on a copper layer, which copper layer is bonded to a printed circuit dielectric substrate.

3. The process of claim 1 wherein the solution contains HCl or H$_3$PO$_4$ acid and selenium dioxide.

4. The process of claim 3 wherein the acid is about 0.15 to 1 g/l and the selenium dioxide is about 2 to 5 g/l.

5. A process for preparing a multilayer printed circuit board comprising:
    (a) contacting a dielectric material laminate layer having a copper layer with a copper oxide coating on the copper layer, said copper oxide having been formed by an oxide forming composition, with an aqueous solution containing an element selected from the group consisting of selenium, tellurium, sulfur and mixtures thereof and having a pH of about 1 to 5 for a sufficient time to increase the leach resistance of the copper oxide layer to an acid copper electroplating bath; and
    (b) forming the multilayer printed circuit board by laminating together the layer from step (a) with other layers needed to form the multilayer board.

6. The process of claim 5 wherein the copper oxide coating is formed using as the oxidant an aqueous alkaline solution of a chlorite salt.

7. The process of claim 5 wherein the solution contains a phosphorus acid in an amount of about 0.1 to 50 g/l.

8. The process of claim 7 wherein the phosphrous acid is phosphoric acid.

9. The process of claim 5 wherein the solution contains HCl and selenium dioxide.

10. The process of claim 9 wherein the HCl is about 0.15 to 1 g/l and the selenium dioxide is about 2 to 5 g/l.

* * * * *